(12) United States Patent
Anselmo

(10) Patent No.: US 11,644,147 B2
(45) Date of Patent: May 9, 2023

(54) MOUNTING BRACKET

(71) Applicant: Salvatore Anselmo, Rochester, NY (US)

(72) Inventor: Salvatore Anselmo, Rochester, NY (US)

(*) Notice: Subject to any disclaimer, the term of this patent is extended or adjusted under 35 U.S.C. 154(b) by 0 days.

(21) Appl. No.: 17/942,728

(22) Filed: Sep. 12, 2022

(65) Prior Publication Data

US 2023/0087857 A1   Mar. 23, 2023

Related U.S. Application Data

(63) Continuation-in-part of application No. 29/808,515, filed on Sep. 20, 2021, now Pat. No. Des. 963,469.

(51) Int. Cl.
*F16M 13/02* (2006.01)
*F16M 11/20* (2006.01)
*H05K 5/02* (2006.01)

(52) U.S. Cl.
CPC ........ *F16M 13/02* (2013.01); *F16M 11/2078* (2013.01); *F16M 13/022* (2013.01); *H05K 5/0204* (2013.01)

(58) Field of Classification Search
CPC ............. F16M 11/2078; F16M 13/022; G03B 17/561; A01M 31/002
USPC .......................................... 248/218.4, 219.4
See application file for complete search history.

(56) References Cited

U.S. PATENT DOCUMENTS

| | | | | |
|---|---|---|---|---|
| 1,170,422 A | * | 2/1916 | Denman | F16M 11/14 248/217.2 |
| 4,439,032 A | * | 3/1984 | Congdon | G03B 17/561 396/419 |
| 5,497,214 A | * | 3/1996 | Labree | F16M 11/08 396/428 |
| 6,663,299 B1 | * | 12/2003 | Shupak | G03B 17/00 396/428 |
| 9,188,280 B2 | * | 11/2015 | Congdon | F16M 13/022 |
| 9,255,660 B2 | * | 2/2016 | Zhang | F16M 1/00 |
| 10,465,842 B1 | * | 11/2019 | Garis | F16M 11/2021 |
| 11,221,102 B2 | * | 1/2022 | Palanisamy | F16B 2/08 |
| 2009/0010637 A1 | * | 1/2009 | DeWitt | G03B 17/561 396/428 |
| 2019/0246074 A1 | * | 8/2019 | Sebree | H04N 23/52 |
| 2022/0316650 A1 | * | 10/2022 | Brandt | F16M 11/2028 |

* cited by examiner

*Primary Examiner* — Bradley Duckworth
(74) *Attorney, Agent, or Firm* — Tracy Jong Law Firm; Tracy P. Jong; Cheng Ning Jong

(57) ABSTRACT

A bracket for supporting an object, the bracket including a base; a pair of holding plates pivotably mounted to the base with a pivot; a pair of apertures, each aperture disposed on each holding plate; and a shaft including a first end, a second end and a spherical member disposed on the first end of the shaft, the spherical member is configured to be rotatably coupled to the pair of apertures of the pair of holding plates, wherein the object is configured to be supported on the second end of the shaft.

17 Claims, 18 Drawing Sheets

MOUNTING BRACKET

PRIORITY CLAIM AND RELATED APPLICATIONS

This continuation-in-part application claims the benefit of priority from non-provisional application U.S. Ser. No. 29/808,515 filed on Sep. 20, 2021. Said application is incorporated by reference in its entirety.

BACKGROUND OF THE INVENTION

1. The Field of the Invention

The present invention relates to a bracket for mounting a device. More specifically, the present invention is directed to a bracket for mounting a communication device to a pole where provisions for adjustments in horizontal and vertical planes are critical for the installation and functioning of the communication device.

2. Background Art

The rapid development in wireless communication technologies has required that radios, e.g., 5G and 4G radios, be mounted on utility poles to propagate communication signals to enable communities within the area of influence of the radios to utilize such technologies on their communication devices. Existing mounting brackets are complicated in their construction, include numerous parts and difficult and time-consuming to adjust in the field. Further, as the radios must service customers over a great number of years while disposed in sometimes harsh outdoor environments on poles or towers, it is imperative for the radios to continue to function properly over years. Therefore, the mounting brackets useful for supporting the radios must also survive the outdoor environments without degradations that can affect their ability to maintain the positioning and orientation of the radios.

There exists a need for a bracket suitable for mounting a radio without undue effort, a bracket that is also capable of immobilizing a radio even under high winds and snow loads to prevent degradation to radio signal qualities, a bracket capable of a wide range of adjustments both vertically and horizontally during installation and a bracket that provides a service lifespan which matches the service lifespan of at least the radio it supports.

SUMMARY OF THE INVENTION

In accordance with the present invention, there is provided a bracket for supporting an object, the bracket including:
(a) a base;
(b) a pair of holding plates pivotably mounted to said base with a pivot;
(c) a pair of apertures, each said aperture disposed on each said holding plate; and
(d) a shaft including a first end, a second end and a spherical member disposed on said first end of said shaft, said spherical member is configured to be rotatably coupled to said pair of apertures of said pair of holding plates, wherein the object is configured to be supported on said second end of said shaft.

In one embodiment, at least one of the pair of apertures includes a cup extending from at least one of the pair of apertures, the spherical member is configured to be rotatably coupled to the pair of apertures at the cups, each cup including a depth, each holding plate including a thickness and the depth is greater than the thickness. In one embodiment, the bracket further includes a mounting plate configured to be removably coupled to the second end of the shaft. In one embodiment, the mounting plate is a substantially rectangular plate and the mounting plate includes four holes each disposed substantially on a corner of the mounting plate. In one embodiment, the pivot includes a pair of tabs formed from bent plates of the base and a fastener configured to allow adjustment and fixing of the shaft with respect to the pair of holding plates.

In one embodiment, at least one of the pair of apertures includes at least one slit on an edge of the at least one of the pair of apertures to facilitate adjustment of the spherical member with respect to the pair of apertures. In one embodiment, the base includes at least one aperture configured for receiving a fastener. In one embodiment, the pivot is a connection having a pivot angle of about 0-150 degrees. In one embodiment, the spherical member is configured to have a range of motion of about 0-40 degrees in at least one direction with respect to the pair of holding plates. In one embodiment, the base includes at least one standoff.

In accordance with the present invention, there is further provided a bracket for supporting an object, the bracket including:
(a) a base;
(b) a pair of holding plates pivotably mounted to the base with a pivot;
(c) a pair of cups, each cup disposed on each holding plate; and
(d) a shaft including a first end, a second end and a spherical member disposed on the first end of the shaft, the spherical member is configured to be rotatably coupled to the cups of the pair of holding plates, wherein the object is configured to be supported on the second end of the shaft.

In one embodiment, at least one of the cups includes a depth, at least one of the pair of holding plates includes a thickness and the depth is greater than the thickness. In one embodiment, at least one of the cups includes an aperture disposed at a bottom portion of the at least one of the pair of cups. In one embodiment, the base includes at least one banding slot configured for receiving a band.

An object of the present invention is to provide a bracket suitable for providing a communication device, such as a 5G or 4G, etc., radio, its necessary orientation while mounted on a pole.

Another object of the present invention is to provide a simple bracket suitable for providing a communication device, such as a 5G or 4G, etc., radio, its necessary orientation while mounted on a pole.

Another object of the present invention is to provide a simple bracket that is uncomplicated in its construction process and suitable for providing a communication device, such as a 5G or 4G, etc., radio, its necessary orientation while mounted on a pole.

Whereas there may be many embodiments of the present invention, each embodiment may meet one or more of the foregoing recited objects in any combination. It is not intended that each embodiment will necessarily meet each objective. Thus, having broadly outlined the more important features of the present invention in order that the detailed description thereof may be better understood, and that the present contribution to the art may be better appreciated, there are, of course, additional features of the present invention that will be described herein and will form a part of the subject matter of this specification.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

PARTS LIST

2—bracket
4—base
6—holding plate
8—spherical member
10—pivot
12—axis of rotation
14—tab
16—aperture
18—shaft
20—fastener
22—mounting plate
24—hole
26—holding plate thickness
28—cup thickness or depth
29—cup or socket
30—aperture
32—slit
34—object, e.g., communication device, equipment, etc.
36—cut line
38—stopper
40—collar
42—direction in which fastener is applied
44—pole, e.g., utility pole
46—width of base
48—height of base
50—adjustment angle in vertical plane
52—adjustment angle in horizontal plane
54—range of motion with respect to holding plates
56—first end of shaft
58—second end of shaft
60—capture banding slot
62—bolt
64—nut
66—bolt
68—nut
70—tube
72—standoff
74—band
76—fastener
78—aperture
80—truncated portion of spherical member

PARTICULAR ADVANTAGES OF THE INVENTION

The present bracket includes a shaft for receiving an equipment to be mounted where the shaft that can be orientated in a wide range of angles and orientations with respect to its base, thereby allowing a communication equipment to be orientated according to field requirements while the base is attached to a pole.

The present bracket is compact and includes tabs formed from a base where the tabs support a pivot that allows a shaft of the bracket to be horizontally orientated in a wide range of angles and a ball-and-socket type of arrangement which allows the shaft to be orientated in numerous orientations with respect to its base, thereby allowing a communication equipment to be orientated according to field requirements while the base is attached to a pole.

The present bracket is capable of securing a 4G or 5G radio to a pole as it can withstand wind loads of up to about 190 mph wind and ice load of about 1 inch at 40 mph wind. The installation process of a radio with the present bracket is uncomplicated and not time-consuming. Multiple equipment can be mounted at the same level using banding slots of present brackets, simplifying the installation of multiple equipment on a pole.

DETAILED DESCRIPTION OF A PREFERRED EMBODIMENT

The term "about" is used herein to mean approximately, roughly, around, or in the region of. When the term "about" is used in conjunction with a numerical range, it modifies that range by extending the boundaries above and below the numerical values set forth. In general, the term "about" is used herein to modify a numerical value above and below the stated value by a variance of 20 percent up or down (higher or lower).

Figure 1:
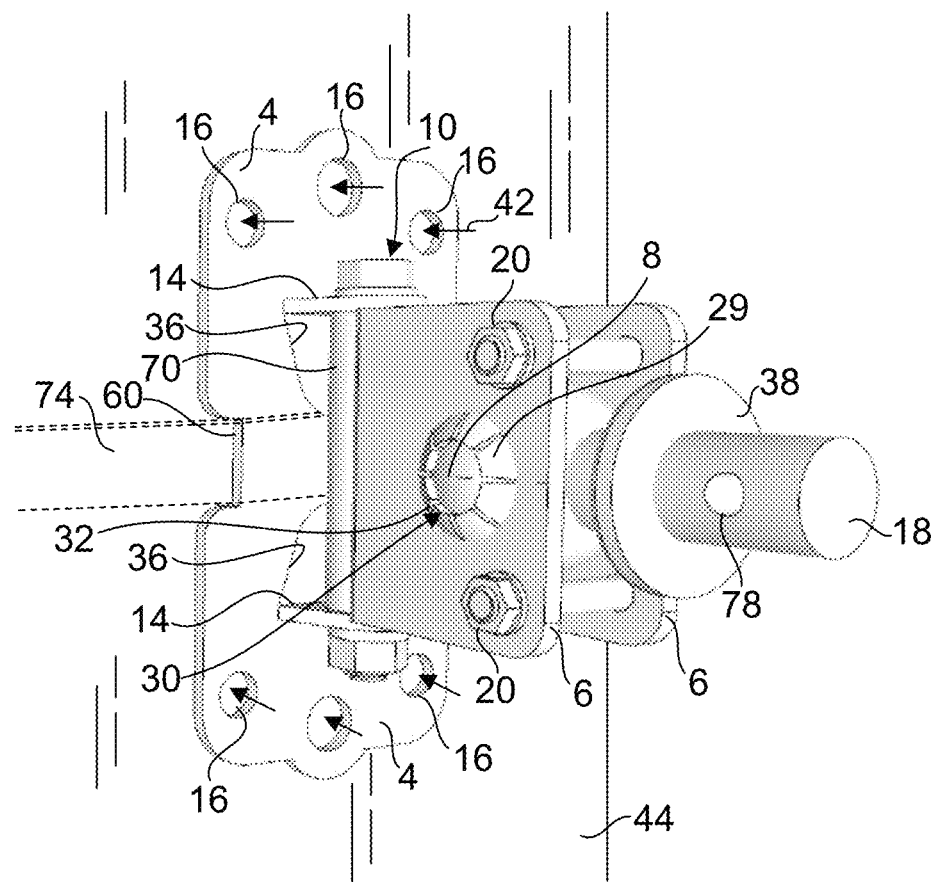
FIG. 1 is a top front view of one embodiment of a bracket configured for mounting an object to a pole where provisions for adjustments in horizontal and vertical planes are critical during installation of the object.
Figure 2:
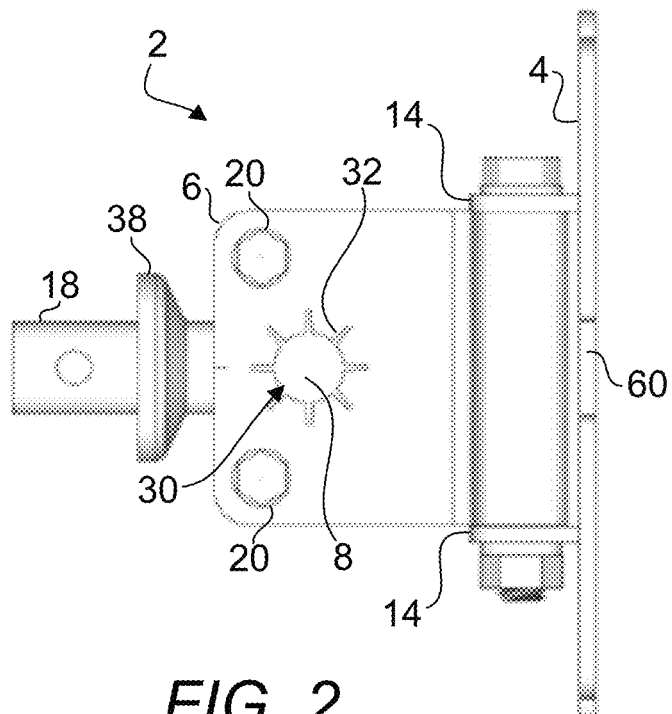
FIG. 2 is a side view of the bracket of FIG. 1.
Figure 3:
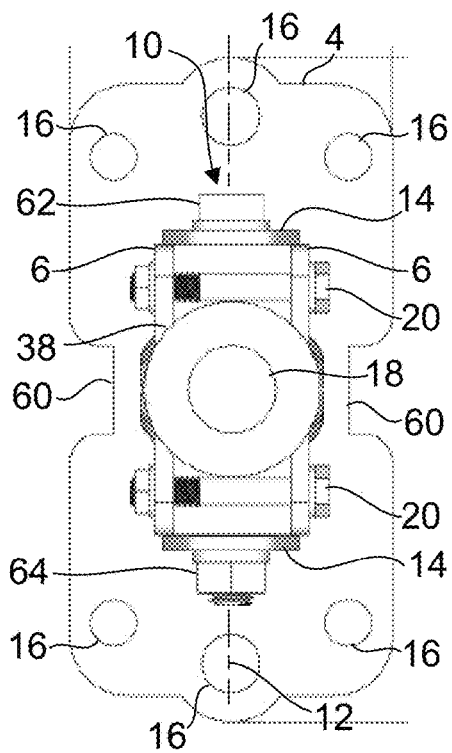
FIG. 3 is a front view of the bracket of FIG. 1.
Figure 4:
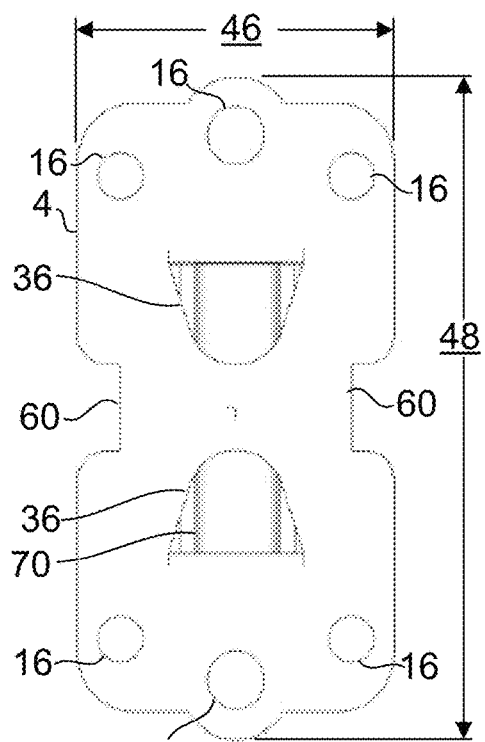
FIG. 4 is a rear view of the bracket of FIG. 1.
Figure 5:
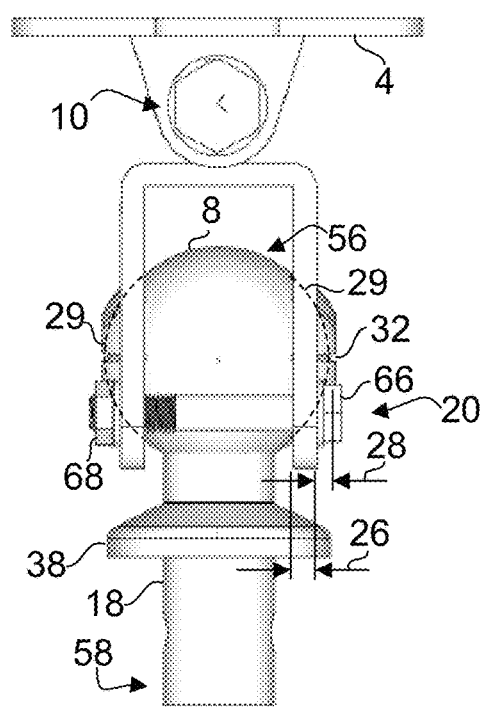
FIG. 5 is a top view of the bracket of FIG. 1.

FIG. 1 is a top front view of one embodiment of a bracket 2 configured for mounting an object to a pole where provisions for adjustments in horizontal and vertical planes are critical during installation of an object 34. FIG. 2 is a side view of the bracket of FIG. 1. FIG. 3 is a front view of the bracket of FIG. 1. FIG. 4 is a rear view of the bracket of FIG. 1. FIG. 5 is a top view of the bracket of FIG. 1. Disclosed herein is a bracket 2 for supporting an object 34, e.g., a 5G, or 4G, etc., radio equipment. The bracket 2 includes a base 4, a pair of holding plates 6 and a shaft 18. The bracket is shown secured to a pole 44 with a band 74. The pair of holding plates 6 is pivotably mounted to the base 4 with a pivot 10 and configured to rotate about axis 12. In the embodiment shown throughout, the pivot includes a pair of tabs 14 formed from bent plates of the base and a fastener 10 configured to allow adjustment and fixing of the pair of holding plates 6 with respect to the base 4. Two cuts are made in the base 4 at cut lines 36, each cut allowing a tab 14 to be bent and disposed in its final form where the tab 14 makes a substantially right angle with the plane in which the rest of the base 4 is disposed. As the tabs 14 are formed from parts of the original base 4, no additional parts are required to be secured to the base 4 to serve as a pivot mount. In the embodiment shown throughout FIGS. 1-4, the pair of holding plates 6 are attached to a tube 70. A fastener including a bolt 62 is disposed through holes in the tabs 14, the tube 70 and secured with a nut 64. In immobilizing the pivot, the nut 64 is simply tightened against the bolt 62. For an adjustment about the pivot 10, the nut 64 is simply loosened against the bolt 62. In the embodiment shown throughout FIGS. 1-4, the pair of holding plates 6 are formed from a single plate. Here, a blank plate is first produced and necessary holes are formed on the blank plate such that fasteners 20 can be used to secure the pair of holding plates 6 against the spherical member 8 to immobilize the spherical member 8 once a favorable positional and orientational relationship for the shaft 18 has been found. Appropriate cups 29 are formed at suitable positions of the plate. The improved plate is then bent to a U-shape with the base of the U-shaped plate attached, e.g., by welding, to the tube 70 and the pair of holding plates 6 substantially parallel to one another and cups 29 facing one another. The shaft 18 includes a first end 56, a second end 58 and the spherical member 8 disposed on the first end of the shaft 18. It shall be noted that each holding plate 6 includes a cup 29. The spherical member 8 is configured to be rotatably coupled to the pair of holding plates 6 at the cups 29 of the pair of holding plates 6. In an embodiment not shown, a cup 29 is not also formed with an aperture 30. The spherical member 8 is configured to be rotatably coupled to the pair of holding plates 6, where an object 34 is configured to be supported on the second end of the shaft 18. Each cup 29 encompasses a depth 28 of, e.g., about 0.5 inch and each of the pair of holding plates 6 has a thickness 26 of, e.g., about ⅜ inch. Here, it shall be noted that the depth 28 is greater than the thickness, therefore a larger surface area of contact is provided between the cups 29 and the spherical member 8 to enable the spherical member 8 to be immobilized more easily and with less effort in tightening fasteners 20 which include, e.g., bolts 66 and nuts 68, e.g., with a tightening torque of, e.g., about 31 ft-lbs on each of the fasteners 20. In addition, the apertures 30 allow penetration or exposure of the spherical member 8 through the apertures 30, essentially allowing the spherical member 8 to be secured with "rings," each having a larger diameter at contact surfaces to more securely hold the spherical member 8 in place given a thickness of the holding plate 6. In one embodiment, a cup can be formed by first creating an aperture through the blank or improved plate. The aperture is then stamped, e.g., with a form tool, in the shape of a cup, bending the worked plate portion in a direction of a stamping force applied through the form tool. In this embodiment, slits 32 configured in a direction radiating from the center of the aperture may be first added to facilitate deformation of the plate around the aperture. The same slits 32 also allow a larger contact surface to be formed in the cup 29 without undue efforts and allow a more ductile contact surface to be made available to more securely hold the spherical member 8 without requiring the use of a separately-available cup. One banding slot 60 is provided on each side of the base to allow a band 74 to be used to secure the base in place, with or without the additional use of fasteners to secure the base 4 in place.

In one embodiment, the pivot includes a pair of tabs formed from bent plates of the base. In one embodiment, at least one of the cups includes an aperture disposed at a bottom portion of the at least one of the cups. In one embodiment, the aperture of the at least one of the cups includes at least one slit on an edge of the aperture of the at least one of the cups. In one embodiment, the base includes at least one aperture 16 configured for receiving a fastener in direction 42. In one embodiment, the pivot is a connection having a pivot angle of about 0-150 degrees. In one embodiment, the spherical member is configured to have a range of motion of about 0-40 degrees in at least one direction with respect to the pair of holding plates. In one preferred embodiment, the bracket is made of hot-rolled steel.

Figure 6:
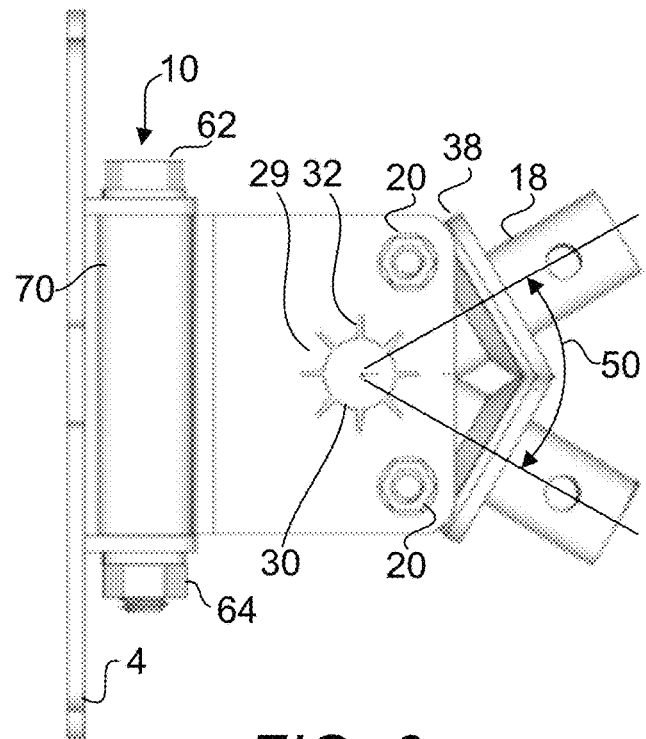
FIG. 6 is a side view of the bracket of FIG. 1, depicting an angle of adjustment in a vertical plane of a shaft of the bracket to which a device can be mounted.

FIG. 6 is a side view of the bracket of FIG. 1, depicting an angle of adjustment in a vertical plane of a shaft 18 of the bracket 2 to which a device can be mounted. The shaft 18 is shown disposed in its two extreme limits. It shall be noted that, in a vertical plane, the shaft 18 can be disposed at an angle 50 of about 0-40 degrees with 0 degrees being a position of the shaft corresponding to the lower vertical limit of the shaft 18 and 40 being a position of the shaft corresponding to the upper vertical limit of the shaft 18. A larger range is possible although for the purpose of mounting a 4G or 5G radio, this range was found to be sufficient.

Figure 7:
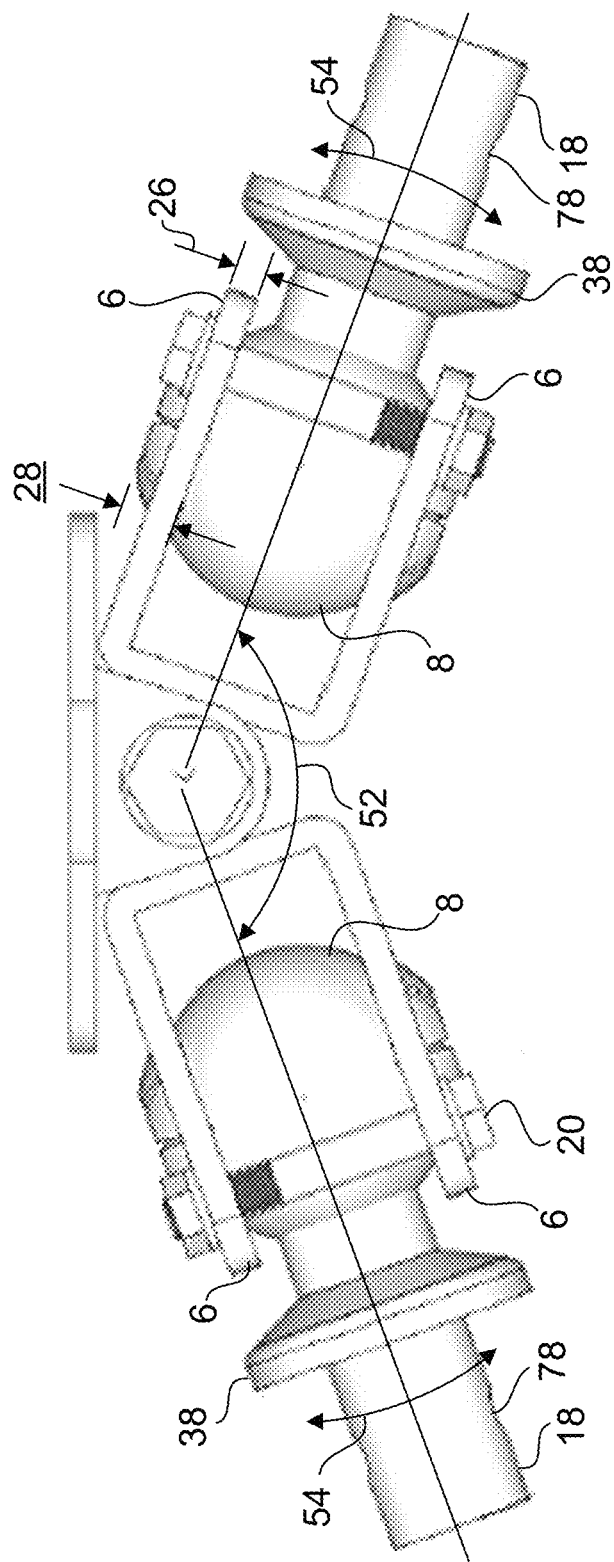
FIG. 7 is a top view of the bracket of FIG. 1, depicting an angle of adjustment in a horizontal plane of a shaft of the bracket to which a device can be mounted.

FIG. 7 is a top view of the bracket of FIG. 1, depicting an angle of adjustment in a horizontal plane of a shaft 18 of the bracket 2 to which a device can be mounted. It shall be noted that, in a horizontal plane, the shaft 18 can be disposed at an angle 52 of about 0-150 degrees. Again, a larger range is possible although for the purpose of mounting a radio, this range was found to be sufficient. It shall also be noted that each spherical member 8 is capable of adjustment in direction 54 as well as any other direction with respect to the holding plates 6.

Figure 8:
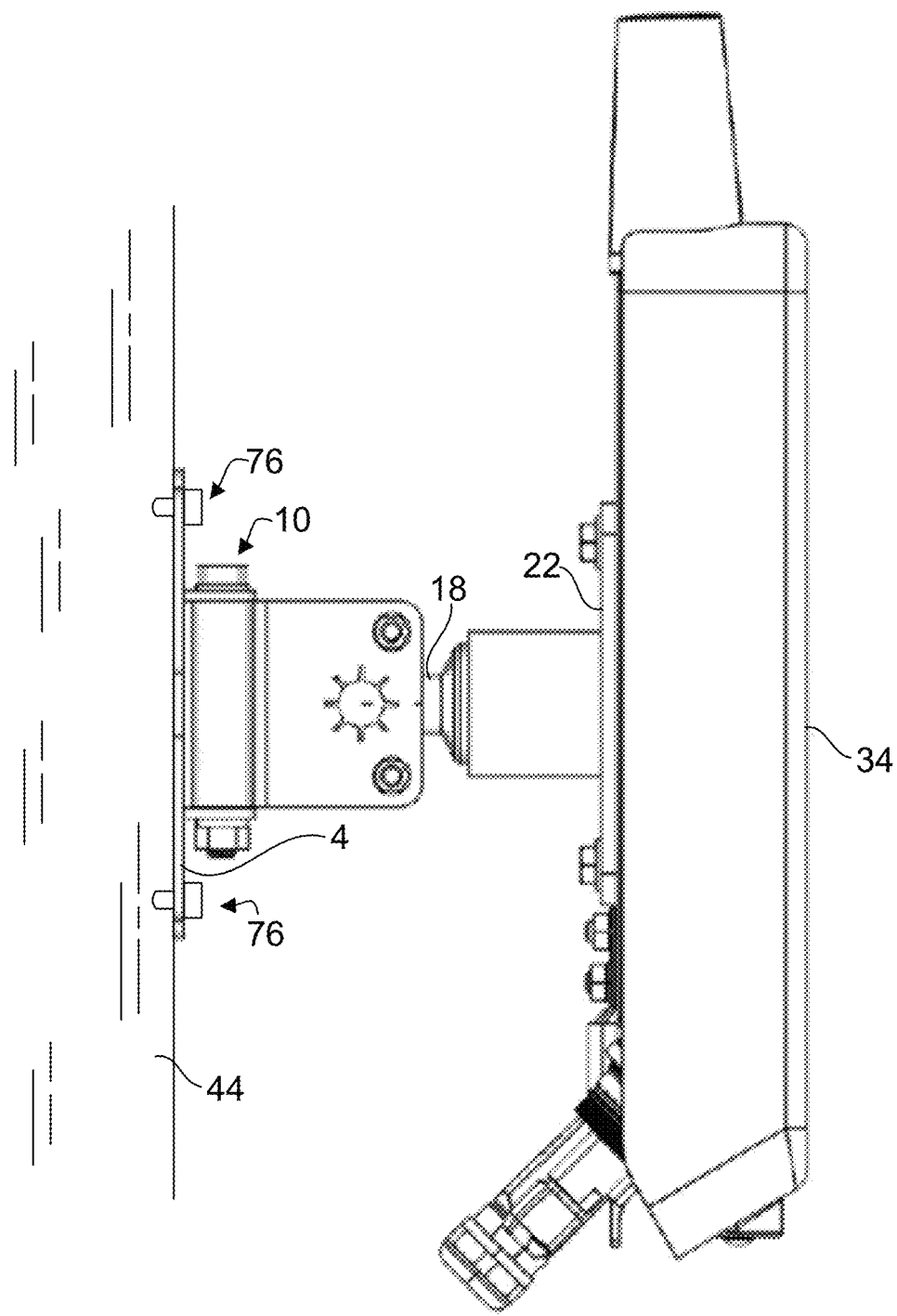
FIG. 8 is a side view of the bracket of FIG. 1, depicting a device having been mounted to a shaft of the bracket.
Figure 9:
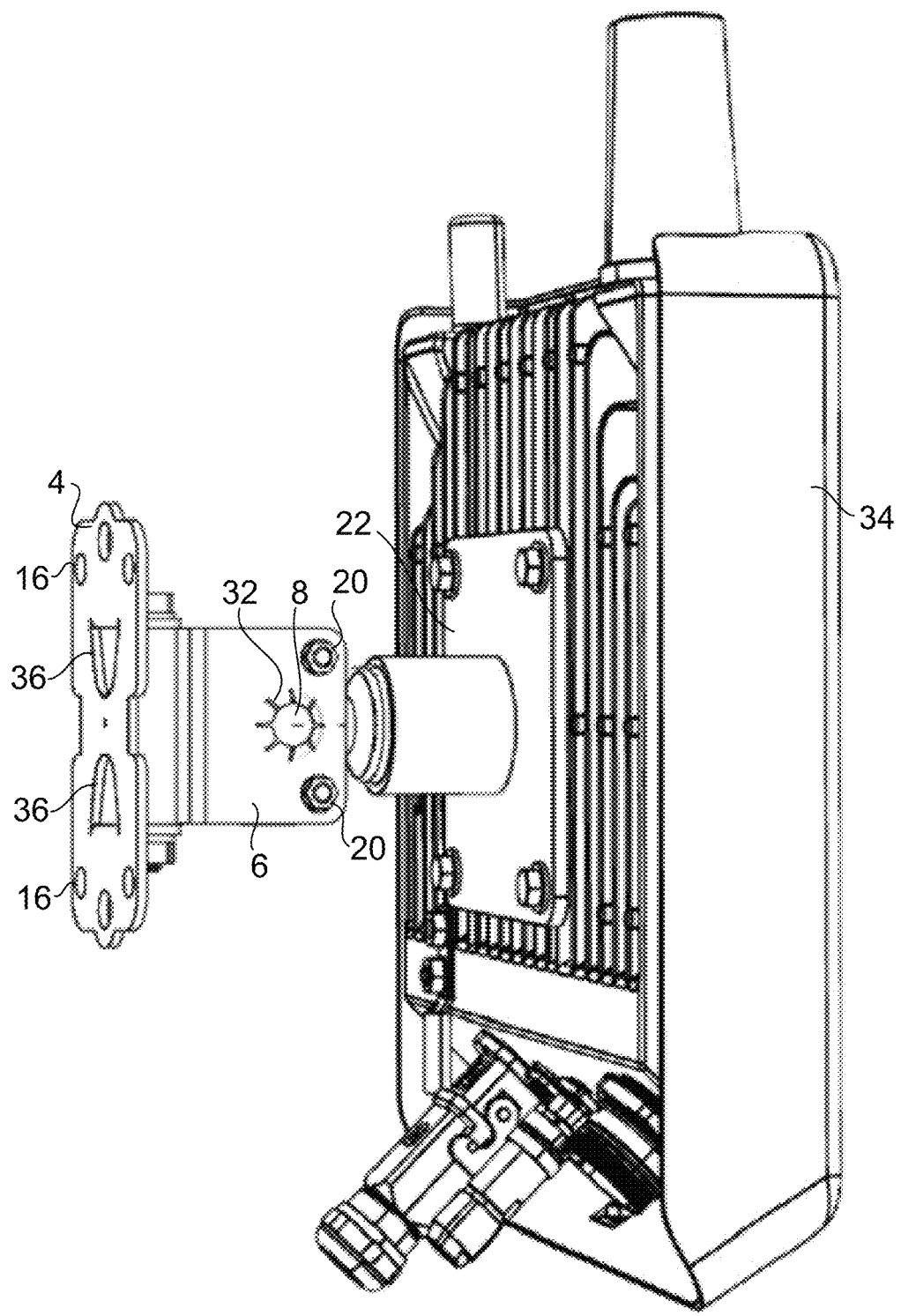
FIG. 9 is a side rear view of the bracket of FIG. 1, depicting a device having been mounted to a shaft of the bracket.

In one embodiment, the bracket further includes a mounting plate 22 configured to be removably coupled to the second end of the shaft 18 as shown in FIGS. 8-12. In one embodiment, the mounting plate 22 is a substantially rectangular plate and the mounting plate includes four holes 24 each disposed substantially on a corner of the mounting plate 22. FIG. 8 is a side view of the bracket of FIG. 1, depicting an object, e.g., device 34, having been mounted to a shaft of the bracket. It shall be noted that in this example, the bracket is secured to a pole by disposing fasteners 76 through apertures 16 and securing the base 4 to the pole 44, without using a band. FIG. 9 is a side rear view of the bracket of FIG. 1, depicting a device 34 having been mounted to a shaft 18 of the bracket using a mounting plate 22 connected to a collar 40 removably attachable to the shaft 18.

Figure 10:
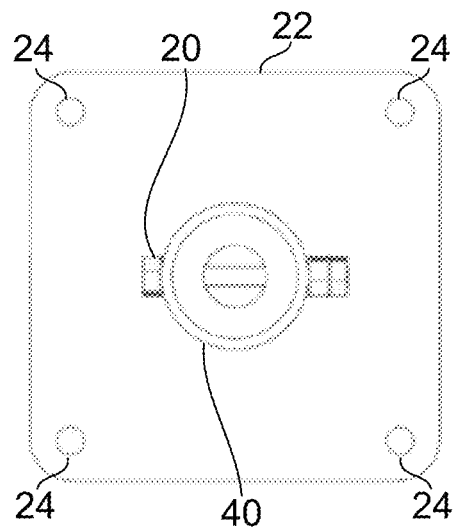
FIG. 10 is a rear view of a mounting plate suitable to be coupled with a shaft of the bracket disclosed elsewhere herein to mount the device.
Figure 11:
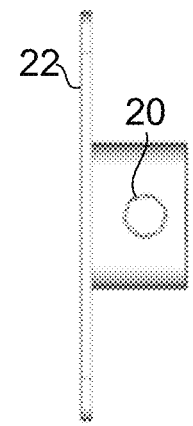
FIG. 11 is a side view of the mounting plate of FIG. 10.
Figure 12:
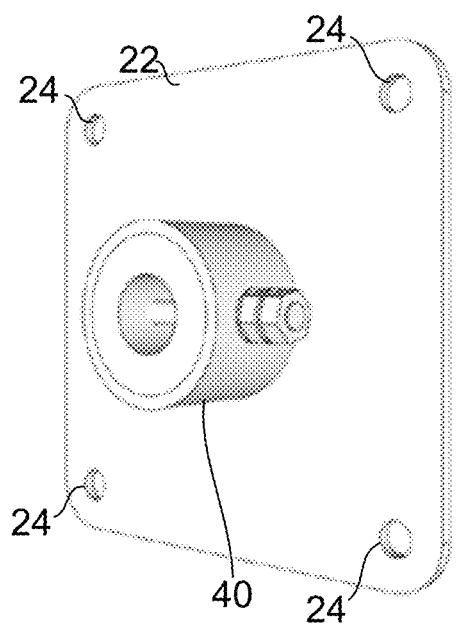
FIG. 12 is a side rear view of the mounting plate of FIG. 10.

FIG. 10 is a rear view of a mounting plate suitable to be coupled with a shaft 18 of the bracket disclosed elsewhere herein to mount the device. FIG. 11 is a side view of the mounting plate of FIG. 10. FIG. 12 is a side rear view of the mounting plate of FIG. 10. A plurality of holes 24, each located near a corner of the mounting plate 22, are provided such that fasteners disposed through the holes 24 may be used to secure an object, e.g., device 34 as shown in FIGS. 8 and 9. In the embodiment shown herein, the mounting plate 22 further includes a collar 40 extending from substantially a central location of the mounting plate 22. The collar 40 is preferably sized sufficiently large to allow it to be slid over the shaft and secured to the shaft. Through holes are disposed on the collar 40 to allow a fastener 20 to be inserted through these holes and aperture 78 of the shaft 18 to secure the mounting plate 22 to the shaft 18.

Figure 13:
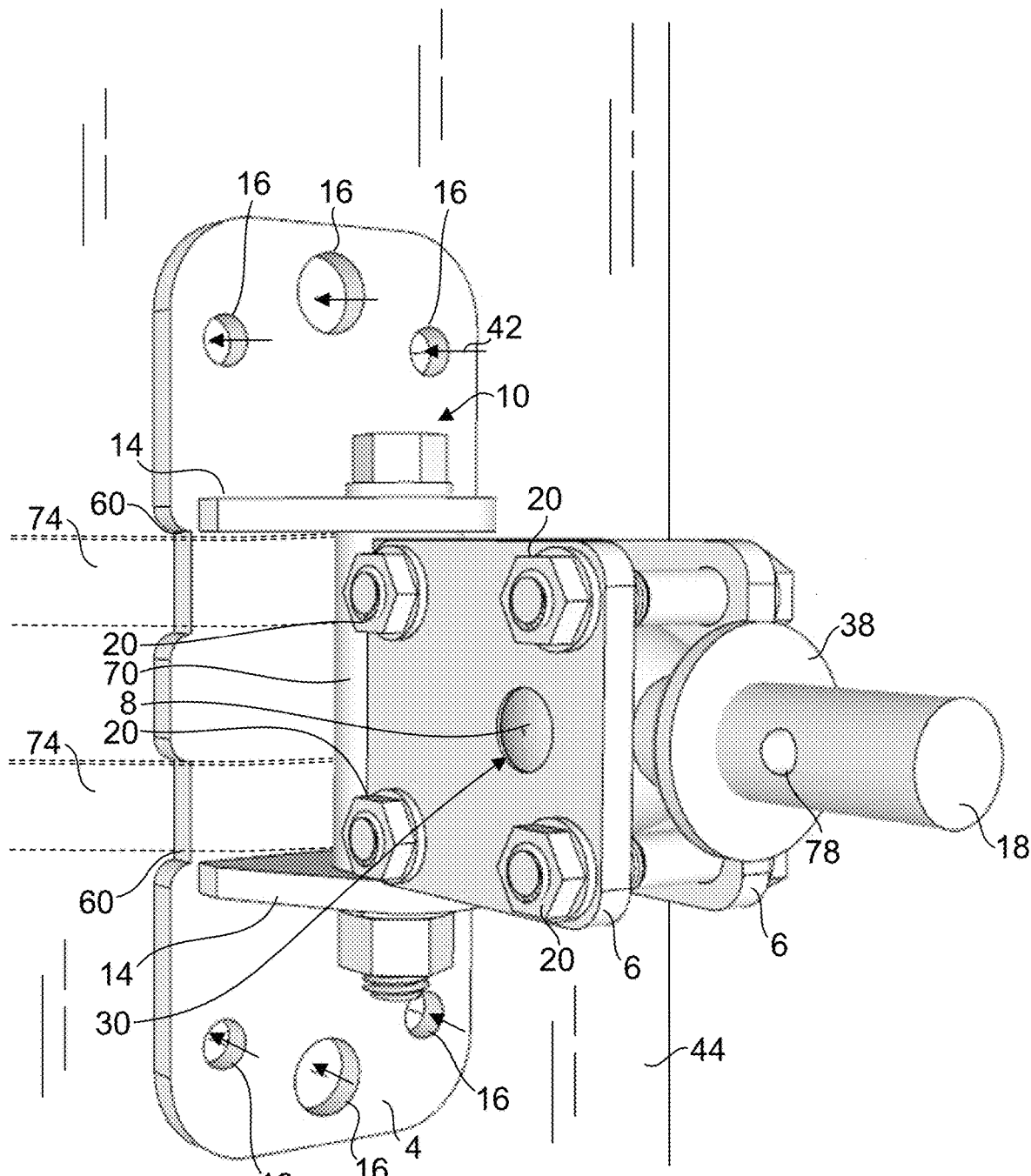
FIG. 13 is a top front view of another embodiment of a bracket configured for mounting an object to a pole where provisions for adjustments in horizontal and vertical planes are critical during installation of the object.
Figure 14:
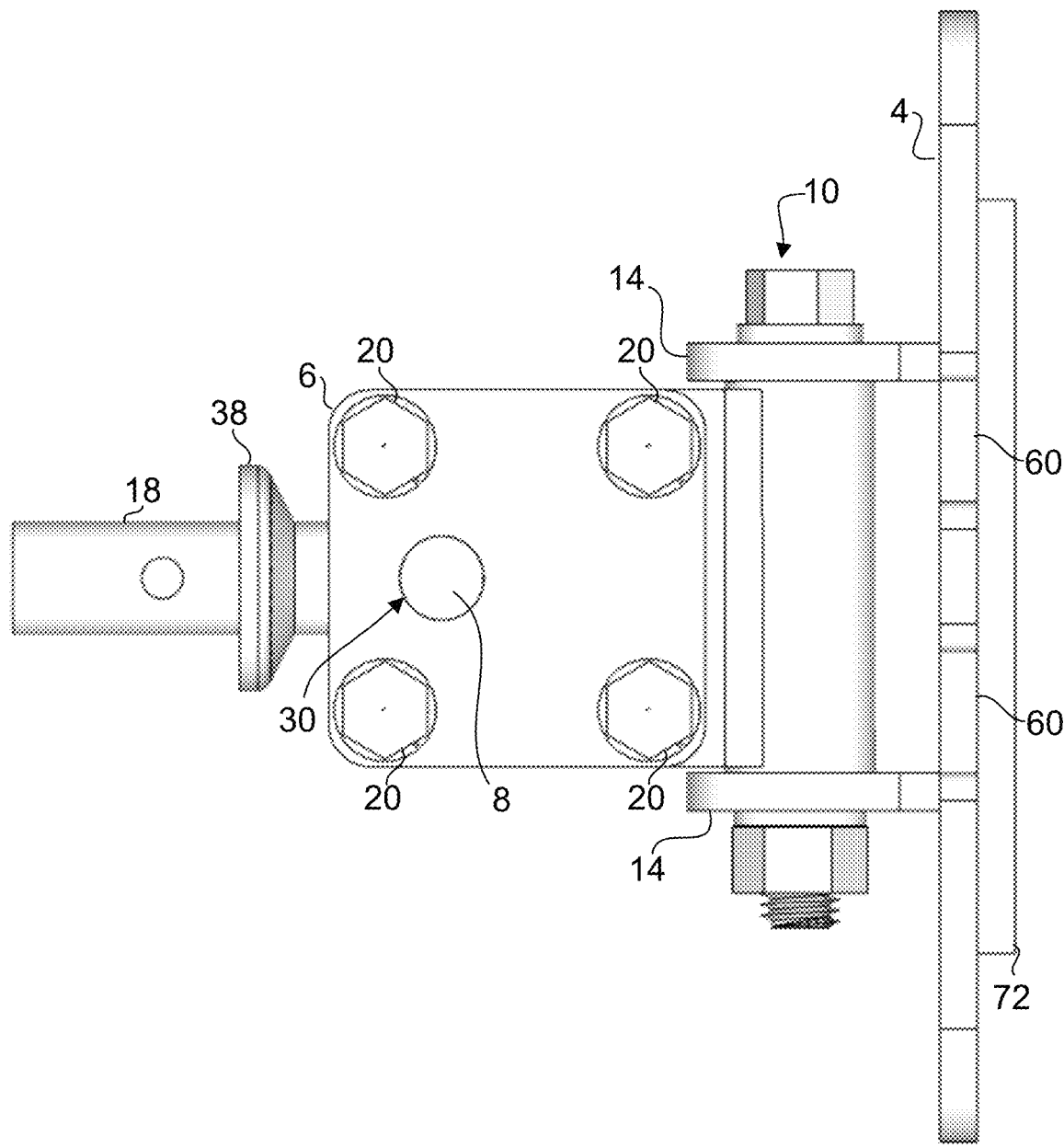
FIG. 14 is a side view of the bracket of FIG. 13.
Figure 15:
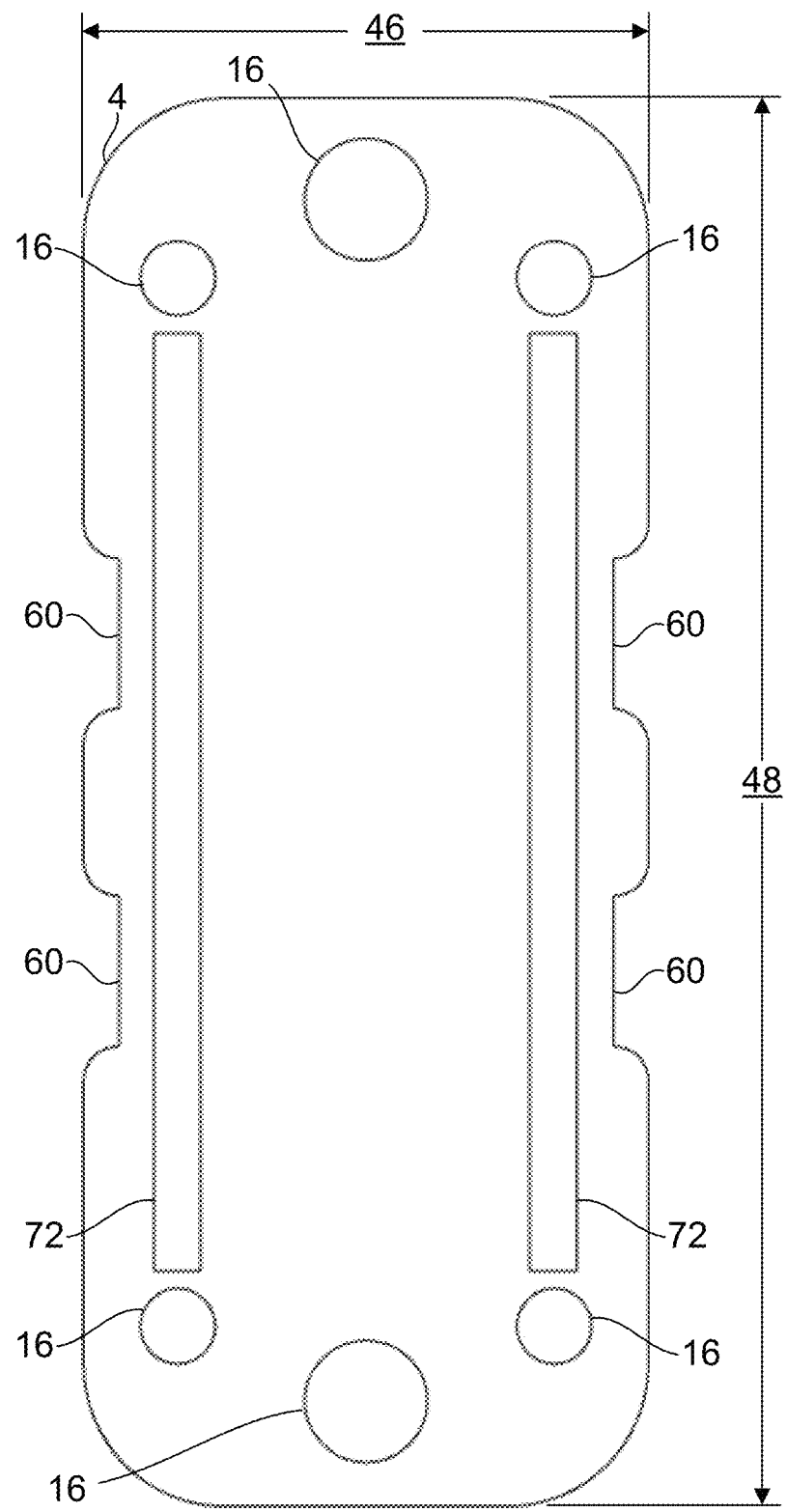
FIG. 15 is a rear view of the base of the bracket of FIG. 13.
Figure 16:
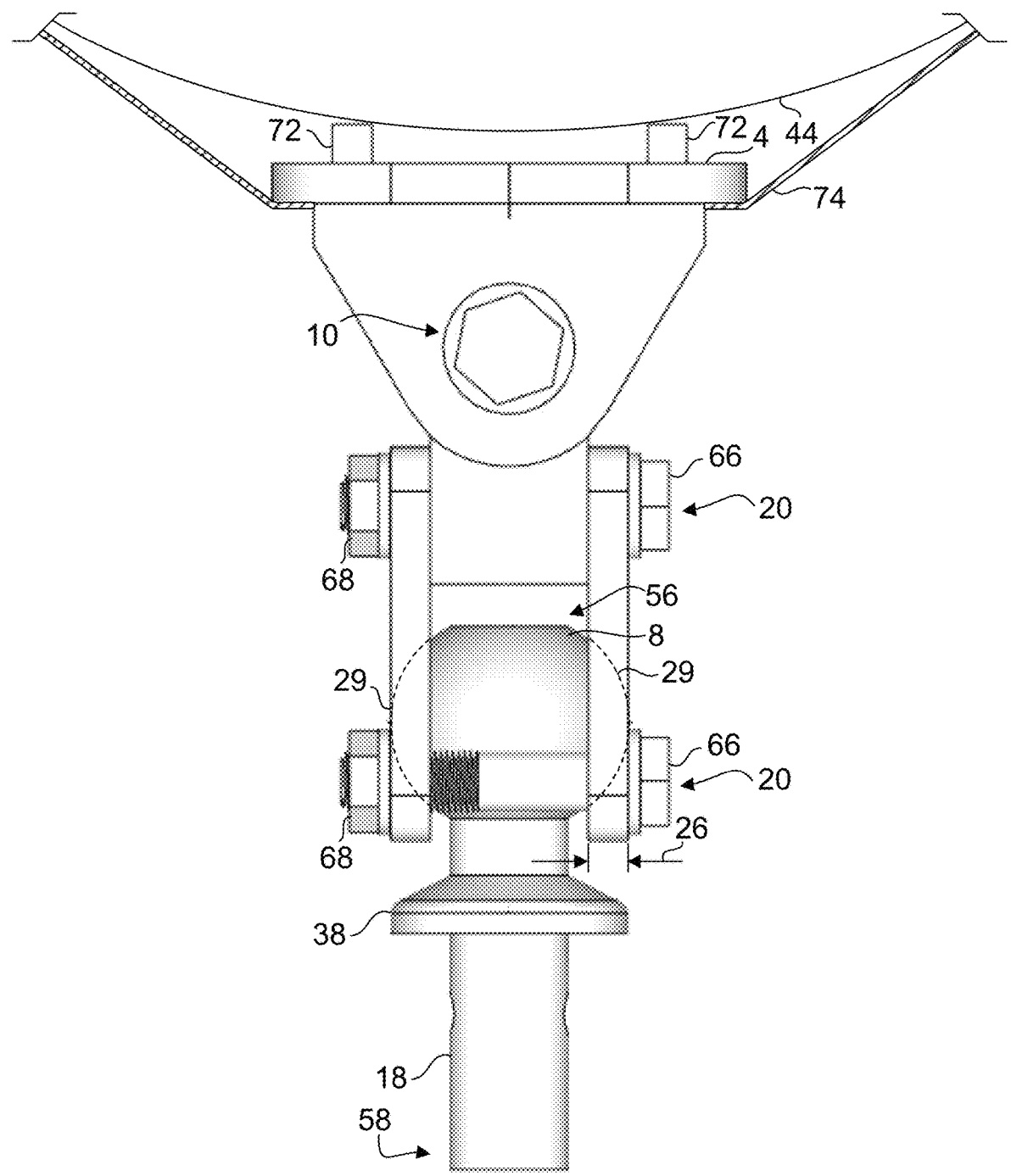
FIG. 16 is a top view of the bracket of FIG. 13.
Figure 17:
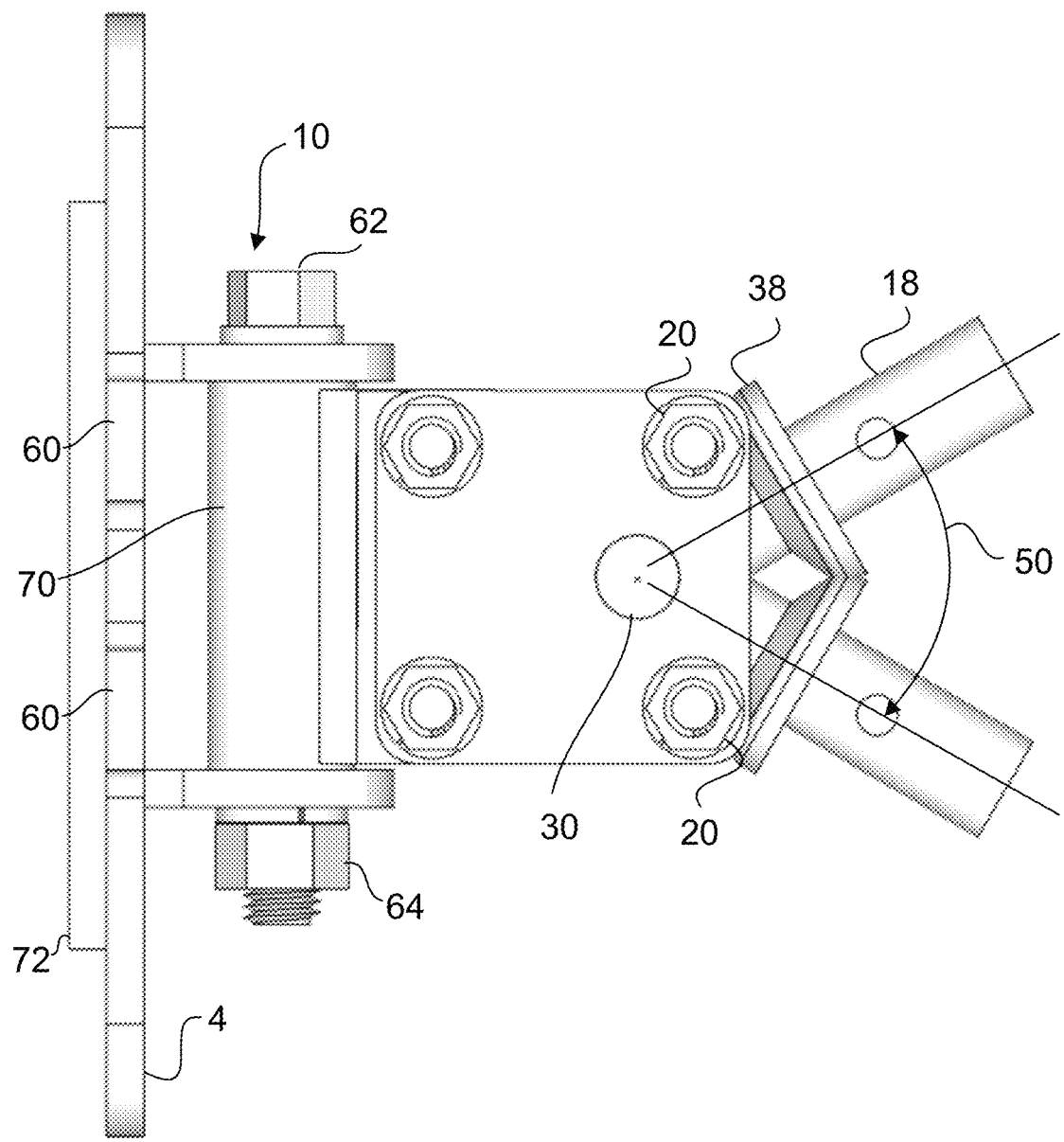
FIG. 17 is a side view of the bracket of FIG. 13, depicting an angle of adjustment in a vertical plane of a shaft of the bracket to which a device can be mounted.
Figure 18:
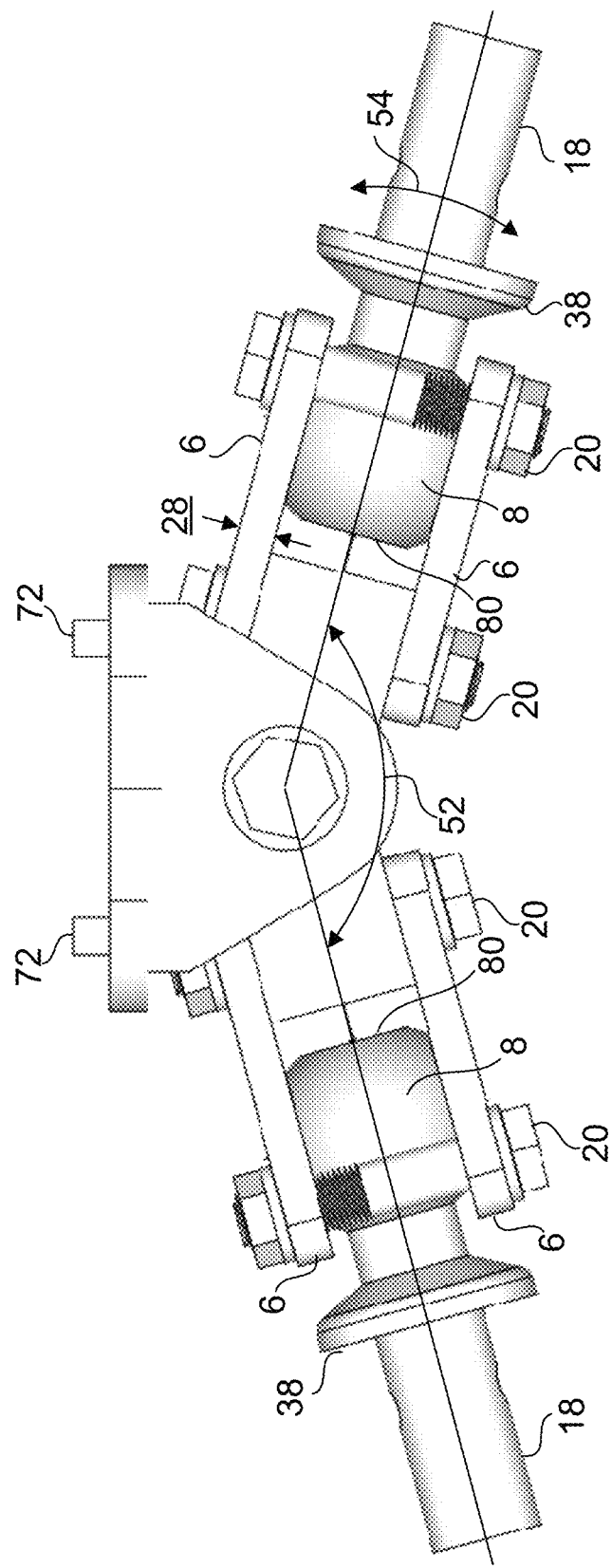
FIG. 18 is a top view of the bracket of FIG. 13, depicting an angle of adjustment in a horizontal plane of a shaft of the bracket to which a device can be mounted.

FIG. 13 is a top front view of another embodiment of a bracket configured for mounting an object to a pole where provisions for adjustments in horizontal and vertical planes are critical during installation of the object. FIG. 14 is a side view of the bracket of FIG. 13. FIG. 15 is a rear view of the base of the bracket of FIG. 13. FIG. 16 is a top view of the bracket of FIG. 13. FIG. 17 is a side view of the bracket of FIG. 13, depicting an angle of adjustment in a vertical plane of a shaft of the bracket to which a device can be mounted. Again, the shaft 18 is shown disposed in its two extreme limits. FIG. 18 is a top view of the bracket of FIG. 13, depicting an angle of adjustment in a horizontal plane of a shaft of the bracket to which a device can be mounted. It shall be noted that, in this embodiment, two banding slots 60 are provided to allow two bands 74 to be used to secure the bracket to a pole if desired. It shall be noted that, in this embodiment, two standoffs 72 are disposed on the bottom surface of the base 4 where the standoffs 72 aid in the alignment of the base according to the surface profile of the pole 44, i.e., the elongated standoffs 72 are disposed in substantially parallel configuration to the lengthwise direction of the pole 44. As shown in this embodiment, each cup 29 is formed flush with a holding plate 6. Again, one end of the cup 29 is terminated with an aperture 30 although the aperture 30 stays flush with the outer surface of the holding plate 6. Four fasteners 20 are used to compress the spherical member 8 with the holding plates 6 to ensure that once an orientation of the mounted equipment 34 has been determined, it can be secured in place to withstand even severe wind loads.

Figure 19:
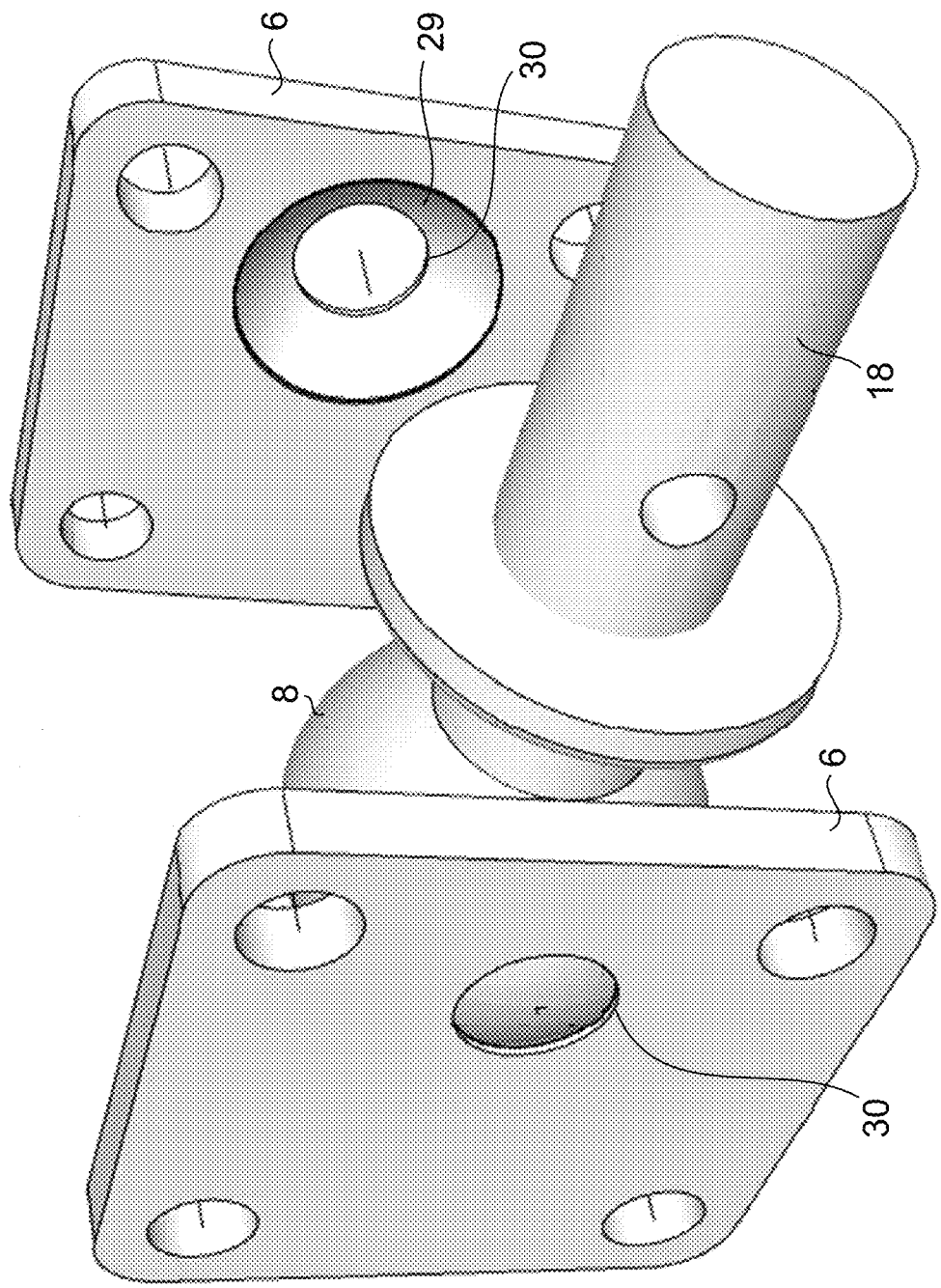
FIG. 19 is a diagram depicting a spherical member configured to interface with a pair of holding plates.
Figure 19A:
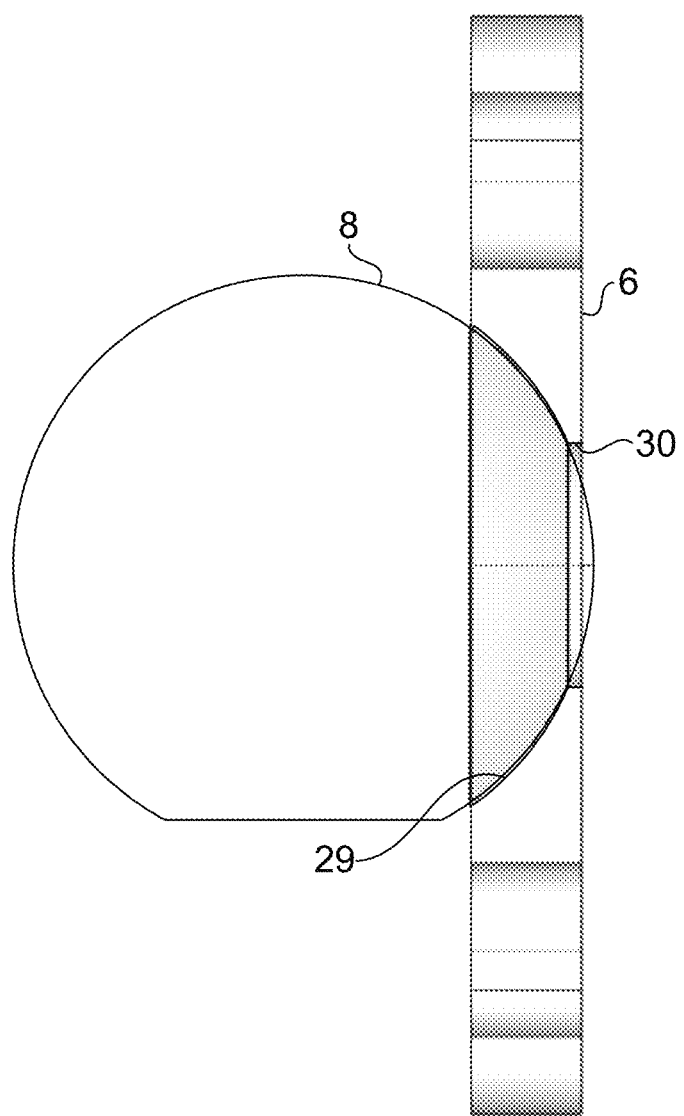
FIG. 19A is a cross-sectional view of a holding plate depicting a cup of a holding plate and a spherical member configured to interface with the cup.
Figure 20:
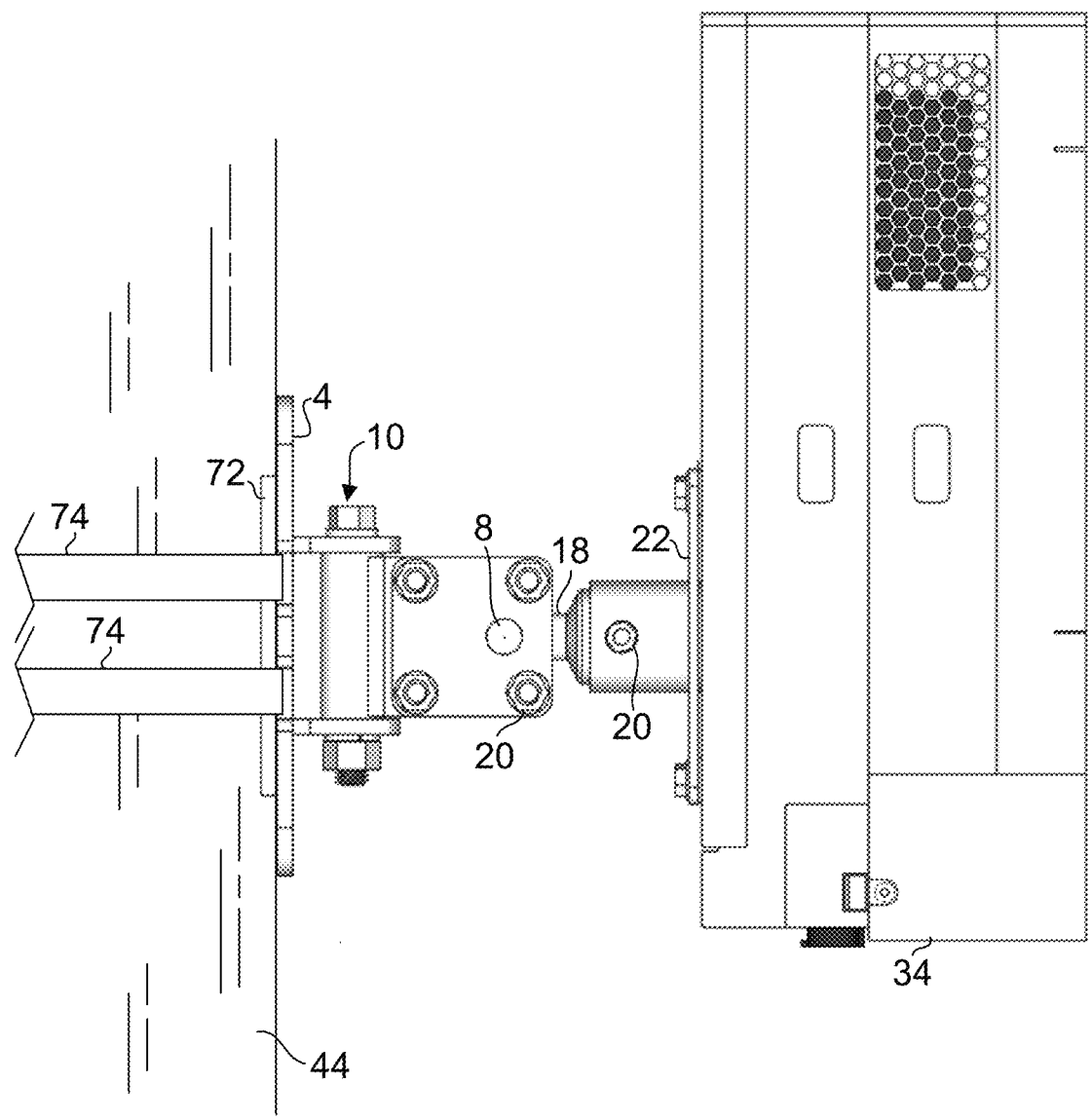
FIG. 20 is a side view of the bracket of FIG. 13, depicting a device having been mounted to a shaft of the bracket.
Figure 21:
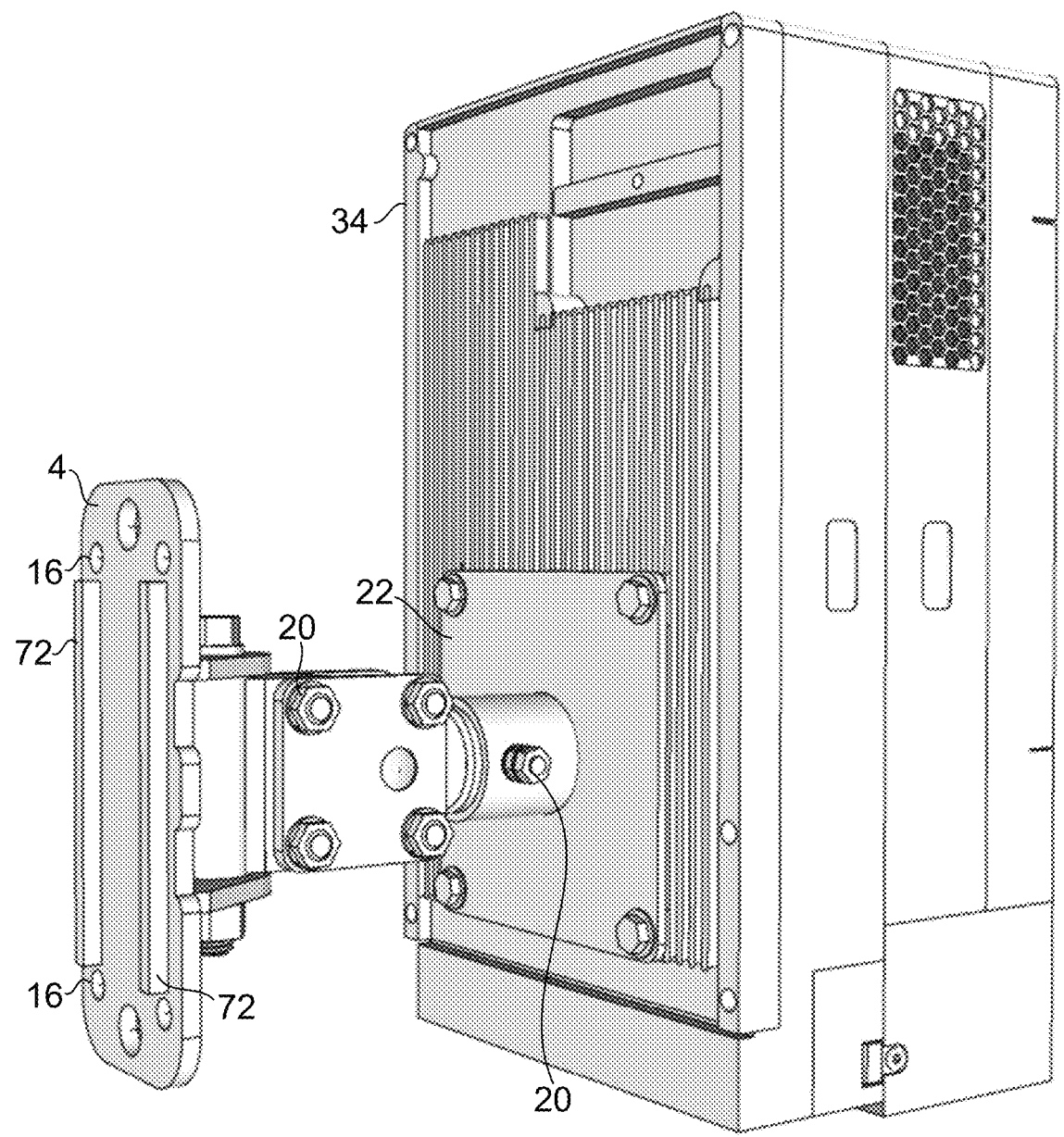
FIG. 21 is a side rear view of the bracket of FIG. 13, depicting a device having been mounted to a shaft of the bracket.
Figure 22:
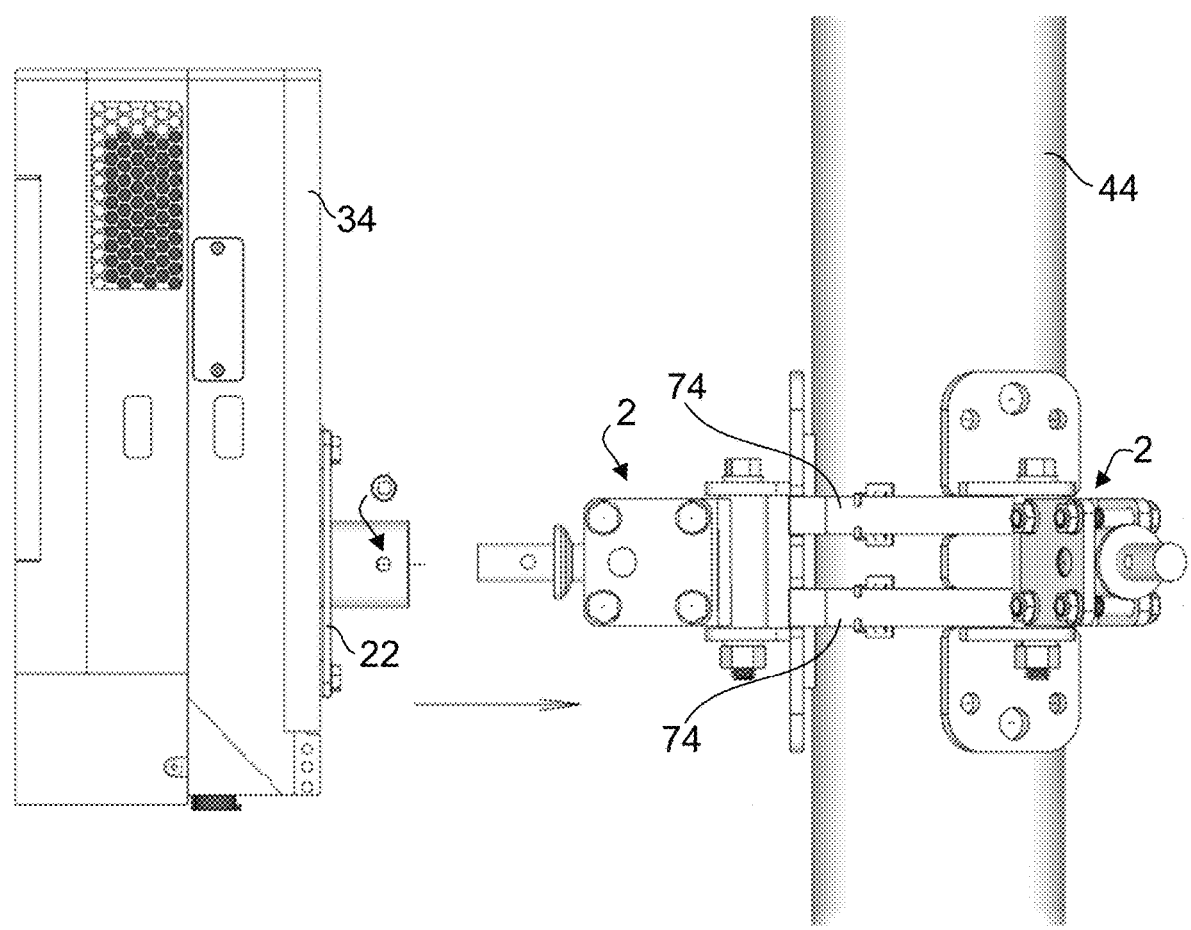
FIG. 22 is a diagram depicting an object being mounted to a bracket while more than one bracket have already been secured to a pole.
Figure 23:
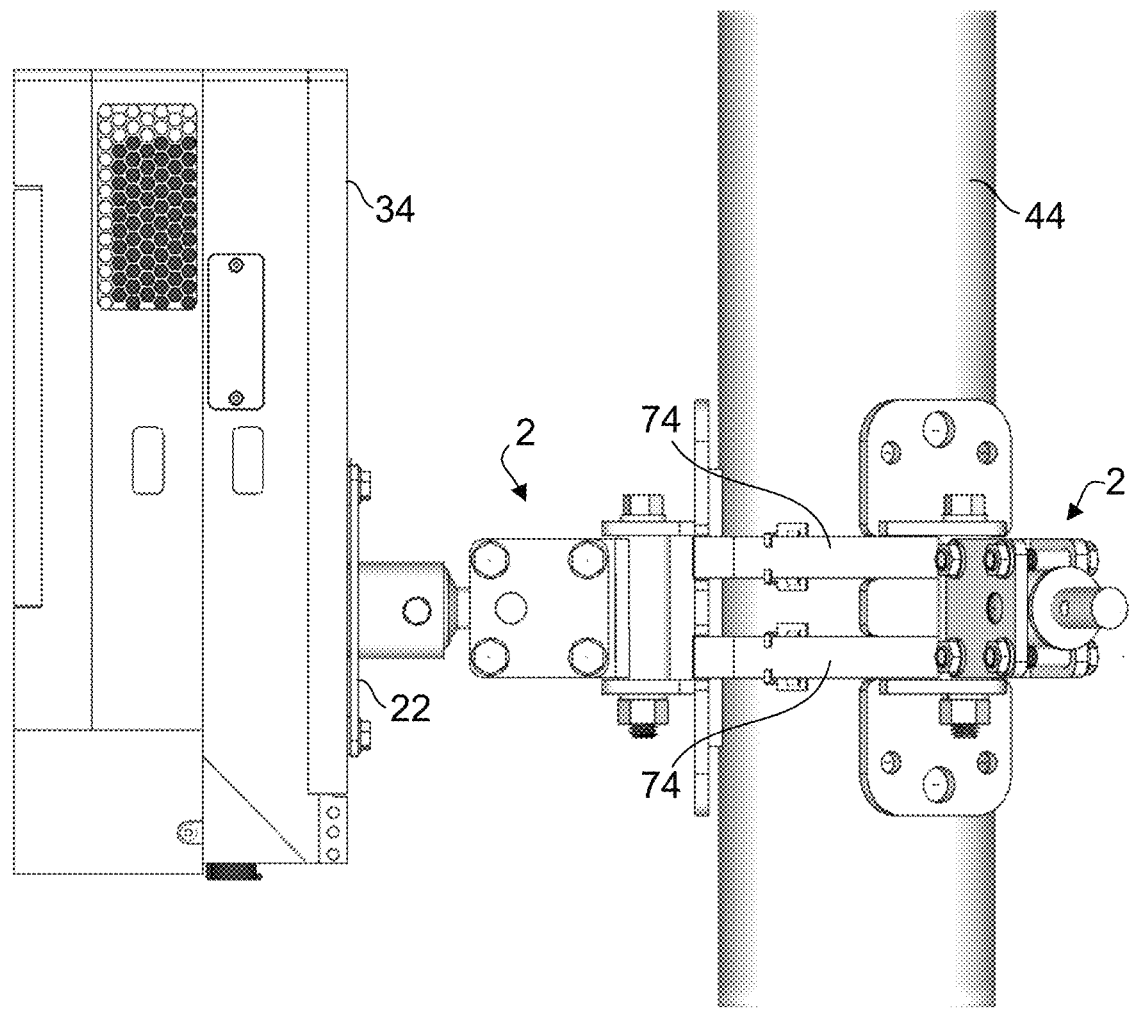
FIG. 23 is a diagram depicting an object having been mounted to a bracket while more than one bracket have already been secured to a pole.

FIG. 19 is a diagram depicting a spherical member 8 configured to interface with a pair of holding plates 6. FIG. 19A is a cross-sectional view of a holding plate 6 depicting a cup of a holding plate 6 and a spherical member 8 configured to interface with the cup 29. The cup is formed from a depression disposed in a holding plate 6 where the depression has a radius of about 0.75 inch and the spherical member 8 has a radius of about 0.725 inch. Upon tightening the holding plates 6 each of about ⅜ inch against the spherical member 8, the spherical member 8 is immobilized and prevented from slipping out of position. FIG. 20 is a side view of the bracket of FIG. 13, depicting a device having been mounted to a shaft 18 of the bracket. FIG. 21 is a side rear view of the bracket of FIG. 13, depicting a device having been mounted to a shaft 18 of the bracket. FIG. 22 is a diagram depicting an object being mounted to a bracket while more than one bracket 2 have already been secured to a pole 44. FIG. 23 is a diagram depicting an object having been mounted to a bracket while more than one bracket 2 have already been secured to a pole 44. It shall be noted that the banding slots 60 have been captured to prevent the brackets 2 and mounted radio 34 from slipping out of position and falling to the ground. In the embodiments shown throughout, each shaft 18 further includes a stopper 38 configured to serve as a limiter to limit a range of travel of the shaft, therefore protecting a device mounted thereon. In one embodiment, the width 46 of the base 4 is about 2-4 inches and the height 48 of the base 4 is about 10 inches.

The detailed description refers to the accompanying drawings that show, by way of illustration, specific aspects and embodiments in which the present disclosed embodiments may be practiced. These embodiments are described in sufficient detail to enable those skilled in the art to practice aspects of the present invention. Other embodiments may be utilized, and changes may be made without departing from the scope of the disclosed embodiments. The various embodiments can be combined with one or more other embodiments to form new embodiments. The detailed description is, therefore, not to be taken in a limiting sense, and the scope of the present invention is defined only by the appended claims, with the full scope of equivalents to which they may be entitled. It will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present disclosed embodiments includes any other applications in which embodiments of the above structures and fabrication methods are used. The scope of the embodiments should be determined with reference to the appended claims, along with the full scope of equivalents to which such claims are entitled.

What is claimed herein is:

1. A bracket for supporting an object, said bracket comprising:
   (a) a base comprising a longitudinal axis;
   (b) a pair of holding plates pivotably mounted to said base with a pivot, wherein said pair of holding plates are configured to pivot about an axis substantially parallel to said longitudinal axis and said pivot comprises a pair of tabs formed from bent plates of said base and a fastener configured to allow adjustment and fixing of said base with respect to said pair of holding plates;

(c) a pair of apertures, each said aperture disposed on each said holding plate; and (d) a shaft comprising a first end, a second end and a spherical member disposed on said first end of said shaft, said spherical member is configured to be rotatably coupled to said pair of apertures of said pair of holding plates to enable orientation adjustments of said spherical member about more than one axis with respect to said pair of holding plates, wherein the object is configured to be supported on said second end of said shaft.

2. The bracket of claim 1, wherein at least one of said pair of apertures comprises a cup extending from said at least one of said pair of apertures, said spherical member is configured to be rotatably coupled to said pair of apertures at said cups, each said cup comprises a depth, each of said pair of holding plates comprises a thickness and said depth is greater than said thickness.

3. The bracket of claim 1, further comprising a mounting plate configured to be removably coupled to said second end of said shaft.

4. The bracket of claim 3, wherein said mounting plate is a substantially rectangular plate and said mounting plate comprises four holes each disposed substantially on a corner of said mounting plate.

5. The bracket of claim 1, wherein said base comprises at least one banding slot configured for receiving a band.

6. The bracket of claim 1, wherein said pivot is a connection having a pivot angle of about 0-150 degrees.

7. The bracket of claim 1, wherein said spherical member is configured to have a range of motion of about 0-40 degrees in at least one direction with respect to said pair of holding plates.

8. The bracket of claim 1, said base comprises at least one standoff.

9. A bracket for supporting an object, said bracket comprising:

(a) a base comprising a longitudinal axis;

(b) a pair of holding plates pivotably mounted to said base with a pivot, wherein said pair of holding plates are configured to pivot about an axis substantially parallel to said longitudinal axis;

(c) a pair of apertures, each said aperture disposed on each said holding plate; and (d) a shaft comprising a first end, a second end and a spherical member disposed on said first end of said shaft, said spherical member is configured to be rotatably coupled to said pair of apertures of said pair of holding plates to enable orientation adjustments of said spherical member about more than one axis with respect to said pair of holding plates, wherein the object is configured to be supported on said second end of said shaft, wherein at least one of said pair of apertures comprises at least one slit on an edge of said at least one of said pair of apertures to facilitate adjustment of said spherical member with respect to said pair of apertures.

10. A bracket for supporting an object, said bracket comprising:

(a) a base comprising a longitudinal axis;

(b) a pair of holding plates pivotably mounted to said base with a pivot, wherein said pair of holding plates are configured to pivot about an axis substantially parallel to said longitudinal axis;

(c) a pair of cups, each said cup disposed on each said holding plate; and (d) a shaft comprising a first end, a second end and a spherical member disposed on said first end of said shaft, said spherical member is configured to be rotatably coupled to said cups of said pair of holding plates to enable orientation adjustments of said spherical member about more than one axis with respect to said pair of holding plates, wherein the object is configured to be supported on said second end of said shaft, wherein at least one of said cups comprises an aperture disposed at a bottom portion of said at least one of said cups and said aperture of said at least one of said cups comprises at least one slit on an edge of said aperture of said at least one of said cups to facilitate adjustment of said spherical member with respect to said pair of cups.

11. The bracket of claim 10, wherein at least one of said pair of cups comprises a depth, at least one of said pair of holding plates comprises a thickness and said depth is greater than said thickness.

12. The bracket of claim 10, further comprising a mounting plate configured to be removably coupled to said second end of said shaft.

13. The bracket of claim 12, wherein said mounting plate is a substantially rectangular plate and said mounting plate comprises four holes each disposed substantially on a corner of said mounting plate.

14. The bracket of claim 10, wherein said base comprises at least one banding slot configured for receiving a band.

15. The bracket of claim 10, wherein said pivot is a connection having a pivot angle of about 0-150 degrees.

16. The bracket of claim 10, wherein said spherical member is configured to have a range of motion of about 0-40 degrees in at least one direction with respect to said pair of holding plates.

17. A bracket for supporting an object, said bracket comprising:

(a) a base comprising a longitudinal axis;

(b) a pair of holding plates pivotably mounted to said base with a pivot, wherein said pair of holding plates are configured to pivot about an axis substantially parallel to said longitudinal axis, wherein said pivot comprises a pair of tabs formed from bent plates of said base and a fastener configured to allow adjustment and fixing of said base with respect to said pair of holding plates;

(c) a pair of cups, each said cup disposed on each said holding plate; and (d) a shaft comprising a first end, a second end and a spherical member disposed on said first end of said shaft, said spherical member is configured to be rotatably coupled to said cups of said pair of holding plates to enable orientation adjustments of said spherical member about more than one axis with respect to said pair of holding plates, wherein the object is configured to be supported on said second end of said shaft.

* * * * *